United States Patent
Yu et al.

(10) Patent No.: US 10,762,972 B2
(45) Date of Patent: Sep. 1, 2020

(54) METHOD AND APPARATUS FOR PROCESSING DATA IN FLASH MEMORY

(71) Applicant: Shenzhen Longsys Electronics Co., Ltd., Shenzhen, Guangdong (CN)

(72) Inventors: Wenzuan Yu, Shenzhen (CN); Xiaoqing Liang, Shenzhen (CN)

(73) Assignee: SHENZHEN LONGSYS ELECTRONICS CO., LTD., Shenzhen (CN)

(*) Notice: Subject to any disclaimer, the term of this patent is extended or adjusted under 35 U.S.C. 154(b) by 80 days.

(21) Appl. No.: 16/175,843

(22) Filed: Oct. 31, 2018

(65) Prior Publication Data

US 2019/0156903 A1    May 23, 2019

(30) Foreign Application Priority Data

Nov. 23, 2017  (CN) .......................... 2017 1 1178871

(51) Int. Cl.
| | |
|---|---|
| *G06F 12/00* | (2006.01) |
| *G11C 16/34* | (2006.01) |
| *G06F 3/06* | (2006.01) |
| *G06F 12/02* | (2006.01) |
| *G11C 16/26* | (2006.01) |

(52) U.S. Cl.
CPC ........ *G11C 16/3431* (2013.01); *G06F 3/0629* (2013.01); *G06F 3/0679* (2013.01); *G06F 12/0246* (2013.01); *G11C 16/26* (2013.01); *G11C 16/3418* (2013.01); *G11C 16/3427* (2013.01); *G06F 2212/1036* (2013.01)

(58) Field of Classification Search
CPC . G11C 16/3431; G11C 16/26; G11C 16/3418; G11C 16/3427; G06F 3/0629; G06F 3/0679; G06F 12/0246; G06F 2212/1036
See application file for complete search history.

(56) References Cited

U.S. PATENT DOCUMENTS

| | | | |
|---|---|---|---|
| 9,575,690 B2* | 2/2017 | Burton | G06F 3/0665 |
| 9,946,671 B1* | 4/2018 | Tawri | G06F 13/28 |
| 2009/0113121 A1* | 4/2009 | Lee | G06F 12/0246 |
| | | | 711/103 |
| 2009/0144393 A1* | 6/2009 | Kudo | G06F 9/5044 |
| | | | 709/218 |
| 2009/0172267 A1 | 7/2009 | Oribe et al. | |

(Continued)

FOREIGN PATENT DOCUMENTS

| | | |
|---|---|---|
| CN | 101546298 A | 3/2008 |
| CN | 101546298 A | 9/2009 |
| TW | 201732533 A | 9/2017 |

*Primary Examiner* — Prasith Thammavong

(57) ABSTRACT

A method and apparatus for processing data in a flash memory are disclosed. The flash memory has a plurality of data blocks for storing data. The method comprises obtaining read modes of read operations which are performed on a data block and a number of each of the read modes, wherein the read modes comprises a sequence read mode and a random read mode, determining a read disturbance value of the data block based on the read modes and the number of each of the read modes, and performing a data move operation for the data block when the read disturbance value of the data block is above a threshold.

14 Claims, 8 Drawing Sheets

(56) References Cited

U.S. PATENT DOCUMENTS

| | | | |
|---|---|---|---|
| 2013/0166839 A1* | 6/2013 | Burton | G06F 3/0643 |
| | | | 711/114 |
| 2013/0332697 A1* | 12/2013 | Hiwatashi | G06F 3/0653 |
| | | | 711/173 |
| 2014/0095555 A1* | 4/2014 | Kim | G06F 16/1847 |
| | | | 707/823 |
| 2015/0339188 A1* | 11/2015 | Hu | G06F 11/1072 |
| | | | 714/704 |
| 2016/0225461 A1 | 8/2016 | Tuers et al. | |
| 2017/0206032 A1 | 7/2017 | Son | |
| 2018/0123931 A1* | 5/2018 | Sun | H04L 41/145 |
| 2019/0163371 A1* | 5/2019 | Nambiar | G06F 3/0685 |

* cited by examiner

METHOD AND APPARATUS FOR PROCESSING DATA IN FLASH MEMORY

CROSS REFERENCE TO RELATED APPLICATIONS

This application claims priority to China Patent Application No. 201711178871.2, filed on Nov. 23, 2017, the contents of which are herein incorporated by reference in its entirety.

TECHNICAL FIELD

The described embodiments relate to flash memories, and in particular to a method and apparatus for processing data in a flash memory.

BACKGROUND

A flash memory is a non-volatile memory with large capacity, high read/write speed, low power consumption and low cost. Since the flash memory has a non-volatile characteristic, data can still be saved in the flash memory after the flash memory is powered off. Therefore, the flash memory can be widely used.

The lifetime of the flash memory is affected by read disturbances and the number of erases of the data block. A read disturbance refers to a voltage applied to other word lines in a data block when a page in the data block is read, which may cause data pages on those word lines to be slightly programmed, and thus, the data of those data pages is disturbed. As the number of read operations increases, the interference effect continually accumulates. Finally, the data in the data block may be invalid, which makes the data block become a bad data block. Moreover, as the erasable number for each data block in the flash memory is limited, frequent erasing will make the data block become a bad data block. The stability for the flash memory may decrease as the number of bad data blocks increases. The flash memory cannot continue to be used when the number of the bad data blocks has accumulated to a certain value.

SUMMARY OF THE DISCLOSURE

The present disclosure is intended to solve at least one of the technical problems in the related art. For this purpose, the present disclosure includes a method and apparatus for processing data in a flash memory, which can determine the read disturbance value more accurately.

According to one aspect of the present disclosure, a method for processing data in a flash memory is provided. The method may include obtaining read modes of read operations, which are performed on a data block and a number of each of the read modes, wherein the read modes comprise a sequence read mode and a random read mode; determining a read disturbance value of the data block based on the read modes and the number of each of the read modes; and performing a data move operation for the data block when the read disturbance value of the data block is above a threshold.

According to another aspect of the present disclosure, an apparatus for processing data in a flash memory is provided. The flash memory has a plurality of data blocks for data storage, and the apparatus comprises a processor configured to: obtain read modes of read operations which are performed on a data block and a number of each of the read modes, wherein the read modes comprise a sequence read mode and a random read mode; determine a read disturbance value of the data block based on the read modes and the number of each of the read modes; and perform a data move operation for the data block when the read disturbance value of the data block is above a threshold.

According to another aspect of the present disclosure, a non-transitory computer readable medium is provided, the non-transitory computer readable medium storing computer programs which, when executed by a processor, cause the processor to process data in a flash memory.

BRIEF DESCRIPTION OF THE DRAWINGS

Embodiments of the present disclosure are illustrated by way of example and not limitations in the figures of the accompanying drawings in which like references indicate similar elements.

DETAILED DESCRIPTION

Embodiments of the present disclosure will be described in detail below, and examples of the embodiments will be illustrated in the accompanying drawings. The embodiments described below with reference to the drawings are illustrative and are intended to explain the present disclosure, and cannot be construed as a limitation to the present disclosure.

Figure 1:
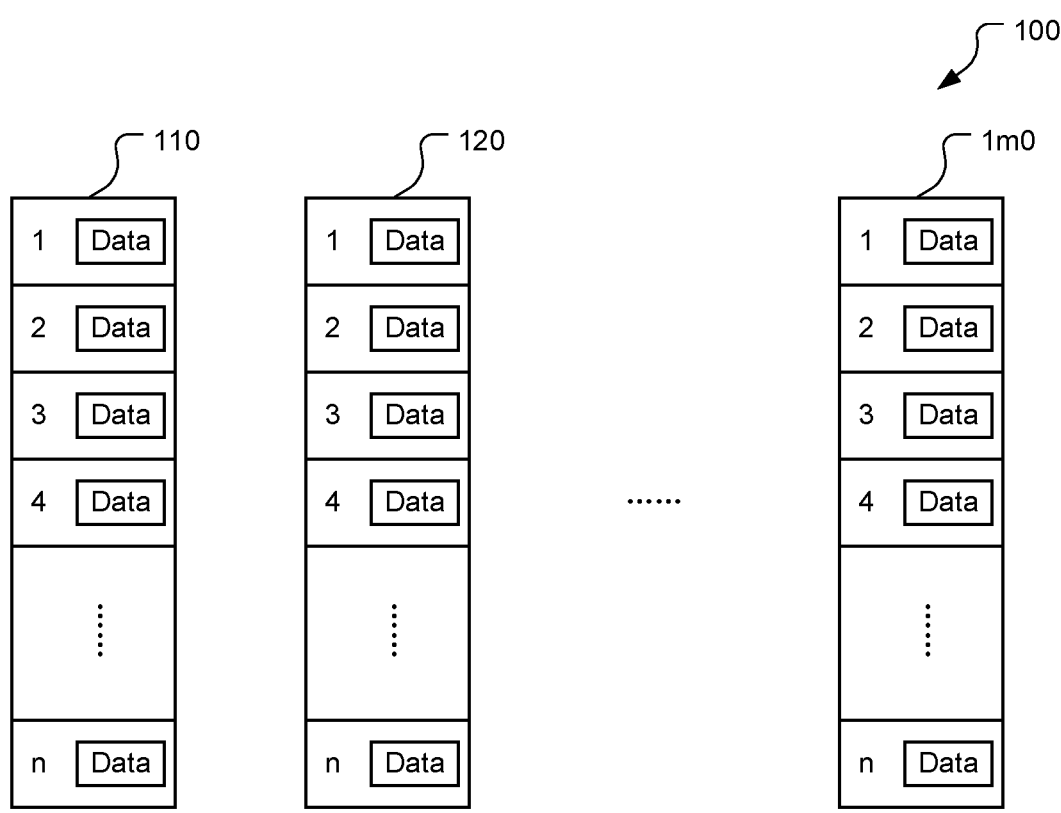
FIG. 1 illustrates a schematic diagram of a flash memory according to an embodiment.

Referring to FIG. 1, a schematic diagram of a flash memory according to an embodiment is illustrated. In one embodiment, the flash memory 100 has a plurality of data blocks. Each data block, such as data block 110, has a plurality of data pages. Each data page stores data. The plurality of data pages 1-n are arranged in an order. In one example, the plurality of data pages are ordered with sequence numbers. For example, a data page with a particular sequence number may be located behind a data page with a lower sequence number. In one example, the flash memory 100 may be a NAND Flash Memory. In the NAND Flash Memory, the data blocks may be NAND Flash blocks.

In the following, a method for processing data in the flash memory 100 according to embodiments of the present disclosure will now be described with reference to FIGS. 1-7.

Figure 2:
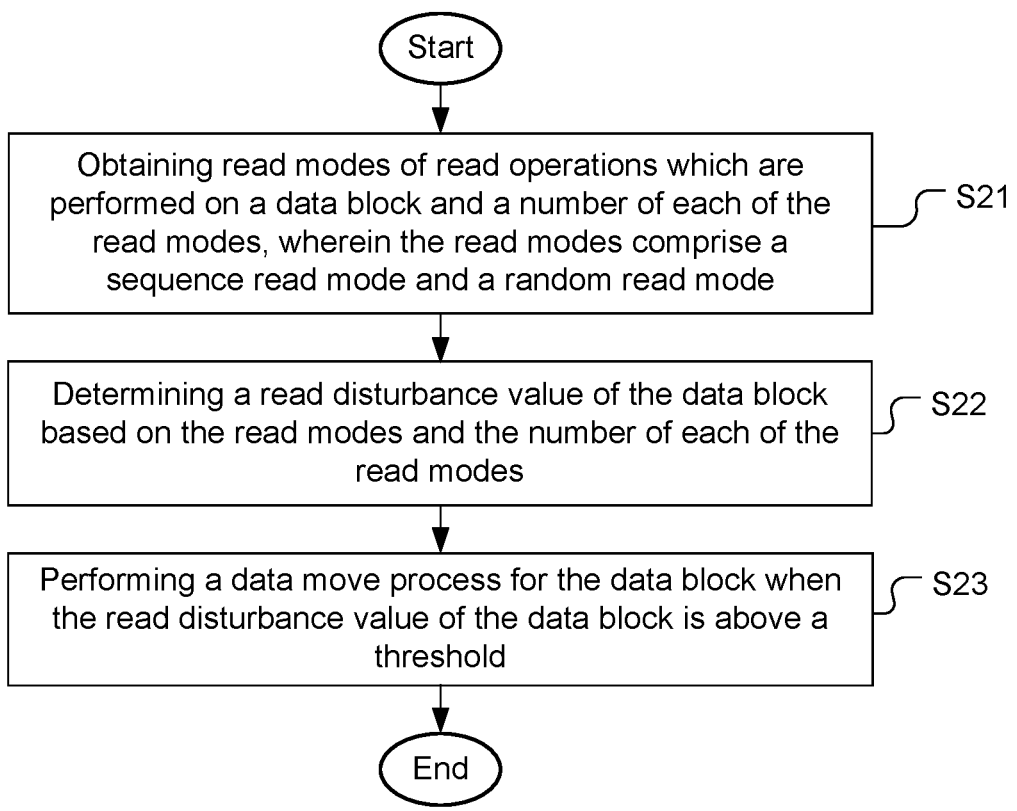
FIG. 2 illustrates a flow chart of a method for processing data in the flash memory according to a first embodiment of the present disclosure.

Referring to FIG. 2, a flow chart of a method for processing data in the flash memory 100 according to a first embodiment of the present disclosure is illustrated. The method may include the following blocks.

At block S21, read modes of read operations, which are performed on a data block and a number of each of the read modes, may be obtained.

The read modes may include a sequence read mode and a random read mode. One read operation is performed on a data block in a read mode, such as the sequence read mode and/or the random read mode.

Taking the data block 110 as an example, the data block 110 can be read in the sequence read mode, which means that the plurality of data pages of the data block 110 are read in a direction. In one example, the direction is in increasing sequence numbers, which can be called a positive direction. For example, the directions 1→2→3→4 and 1→3→7→11 are in the positive direction. In another example, the direction is in decreasing sequence numbers, which can be called a negative direction. For example, the directions 4→4→3→2→1 and 11→7→3→1 are in the negative direction.

Taking the data block 110 as an example, the data block 110 can be read in the random read mode, which means that a plurality of data pages of the data block 110 are read randomly, rather than in any particular direction. For example, the data block 110 can be read in an order such as 7→3→5→4.

At block S22, a read disturbance value of the data block 110 may be determined based on the read modes and the number of each of the read modes.

The read disturbance value of the data block 110 is caused by the read operations performed on the data block 110. The determination of the read disturbance value of the data block 110 may be performed in different ways, which can be described in the following.

At block S23, a data move operation for the data block 110 may be performed when the read disturbance value of the data block 110 is above a threshold value.

When the data move operation is performed, the data in the data block 110 may be moved to a blank data block in the flash memory 100, such as the data block 120. Thus, the data is also in the data block 120. After the data move operation, the data in the data block 110 may become invalid and forbidden from reading and writing. Further, after the data move operation, the data in the data block 110 may be erased, after which the data block 110 may become a new blank data block, which may be used to stored new data.

In this embodiment, the read disturbance value of the data block 110 can be determined based on the read modes and the number of each read mode, so that the read disturbance value of the data block 110 can be determined more accurately. In this way, the data move operation may be performed at an accurate time point, which can lengthen the lifetime of the flash memory 100.

Figure 3:
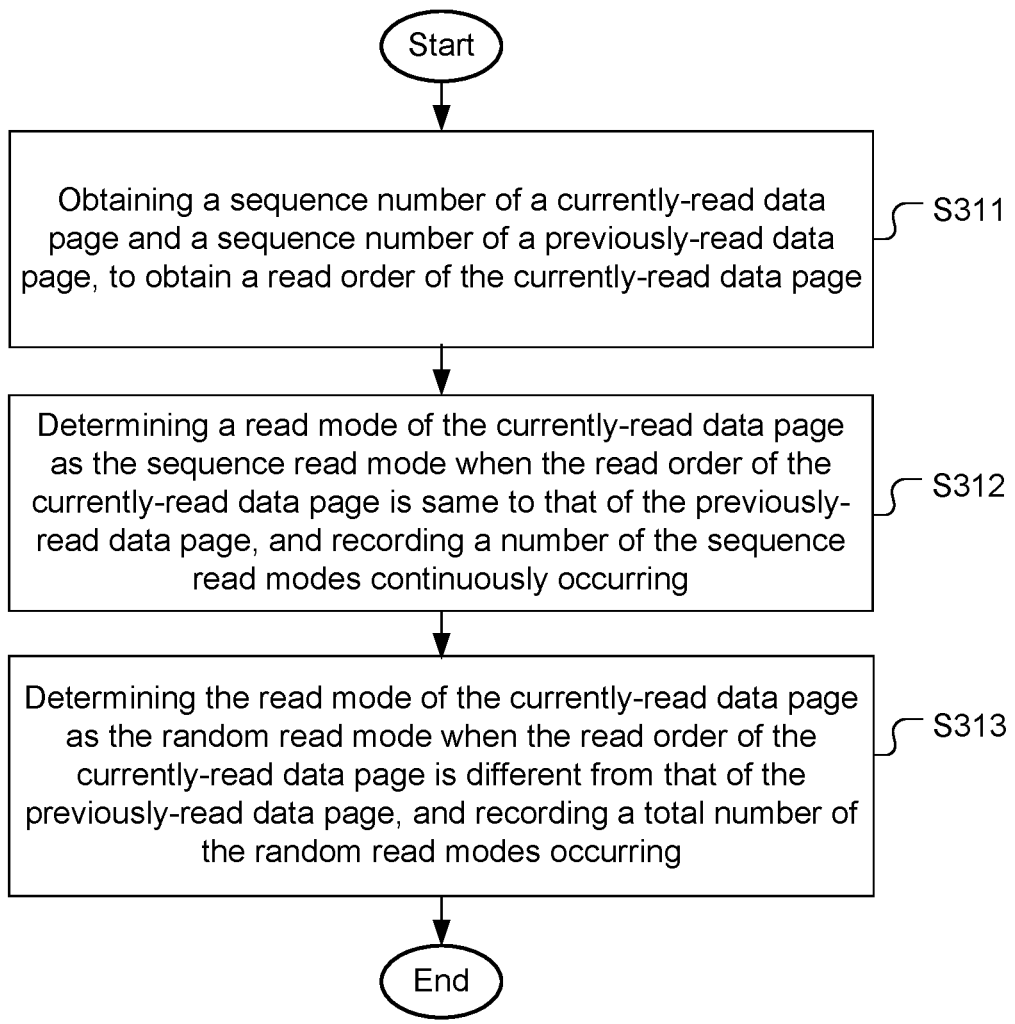
FIG. 3 illustrates a flow chart of a method for processing data in a flash memory according to a second embodiment of the present disclosure.

Referring to FIG. 3, a flow chart of a method for processing data in the flash memory 100 according to a second embodiment of the present disclosure is illustrated. In this embodiment, the read modes of read operation which are performed on the data block 110 and the number of each of the read modes may be obtained, which may be combined with the above embodiment. The block S21 may include the following blocks.

At block S311, a sequence number of a currently-read data page and a sequence number of a previously-read data page are obtained to obtain a read order of the currently-read data page.

The currently-read data page is a target page by a current read operation from the previously-read data page which is a target page by a previous read operation. When the currently-read data page is read by the current read operation, data in the currently-read data page is wholly or partially read. For example, 4K bits of the data in the currently-read data page is read at one time. In the case of the direction being 1→2→3→4, when the currently-read data page is the data page 2, the read order of the data page 2 is the positive direction. In the case of the direction is 4→3→2→1, the read order of the data page 2 is the negative direction. In one example, the sequence number of a data page may be a location where the data page is located in the data block 110 as shown in FIG. 1.

At block S312, the read mode of the currently-read data page is determined as the sequence read mode when the read order of the currently-read data page is same to that of the previously-read data page, and a number of the sequence read modes continuously occurring is recorded.

At block S313, the read mode of the currently-read data page is determined as the random read mode when the read order of the currently-read data page is different from that of the previously-read data page, and a total number of the random read modes occurring is recorded.

It should be noted that the performing order of blocks S311-S313 are only for illustrative purposes, and the blocks S311-S313 may be performed in any order. For example, the block S312 may be performed after the block S313.

In this embodiment, the read mode of the currently-read data page is determined by the read orders of the currently-read data page and the previously-read data page, and then the number of the sequence read modes continuously occurring and the total number of the random read modes occurring may be derived.

Figure 4:
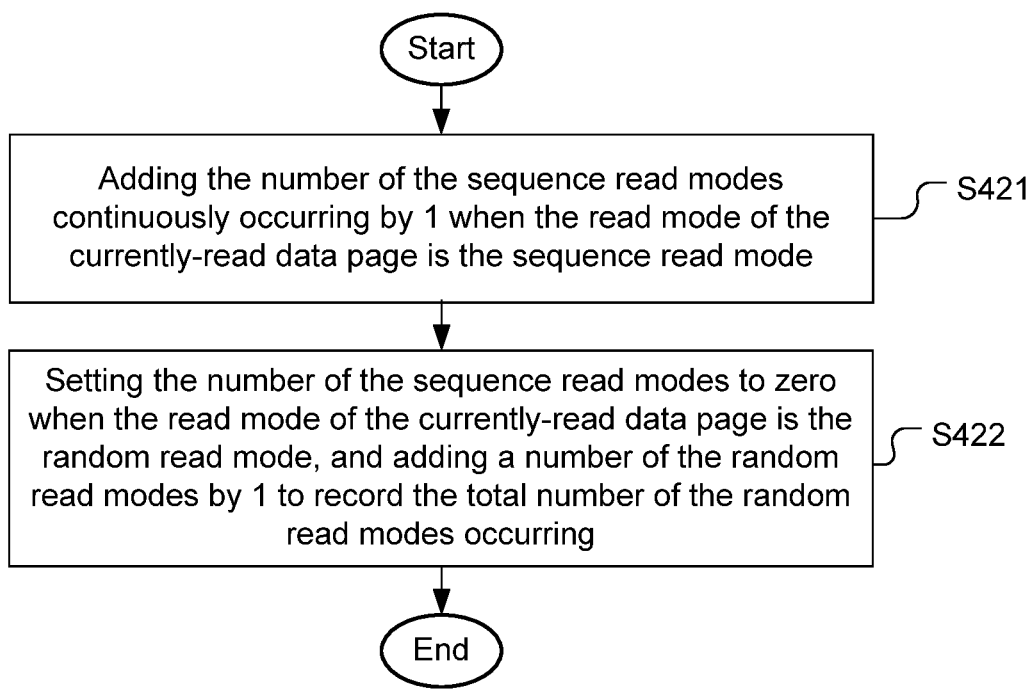
FIG. 4 illustrates a flow chart of a method for processing data in a flash memory according to a third embodiment of the present disclosure.

Referring to FIG. 4, a flow chart of a method for processing data in the flash memory 100 according to a third embodiment of the present disclosure is illustrated. The method in this embodiment is based on the method for processing data in the second embodiment. In this embodiment, the recording a number of the sequence read modes continuously occurring may include the following blocks.

At block S421, the number of the sequence read modes continuously occurring is added by 1 when the read mode of the currently-read data page is the sequence read mode.

At block S422, the number of the sequence read modes is set to zero when the read mode of the currently-read data page is the random read mode, and a number of the random read modes is added by 1 to record the total number of the random read modes occurring.

It should be noted that the performing order of blocks S421-S422 are only for illustrative purposes, and the blocks S421 and S422 may be performed in parallel.

In this embodiment, during recording the number of each read mode, the number of the sequence read modes continuously occurring is initially set to 0, and added by 1 each time the read mode of the currently-read data page is the sequence read mode. The number of the sequence read modes is then set to zero when the read mode of the currently-read data page is the random read mode. At this time, the number of the random read modes is added by 1.

Figure 5:
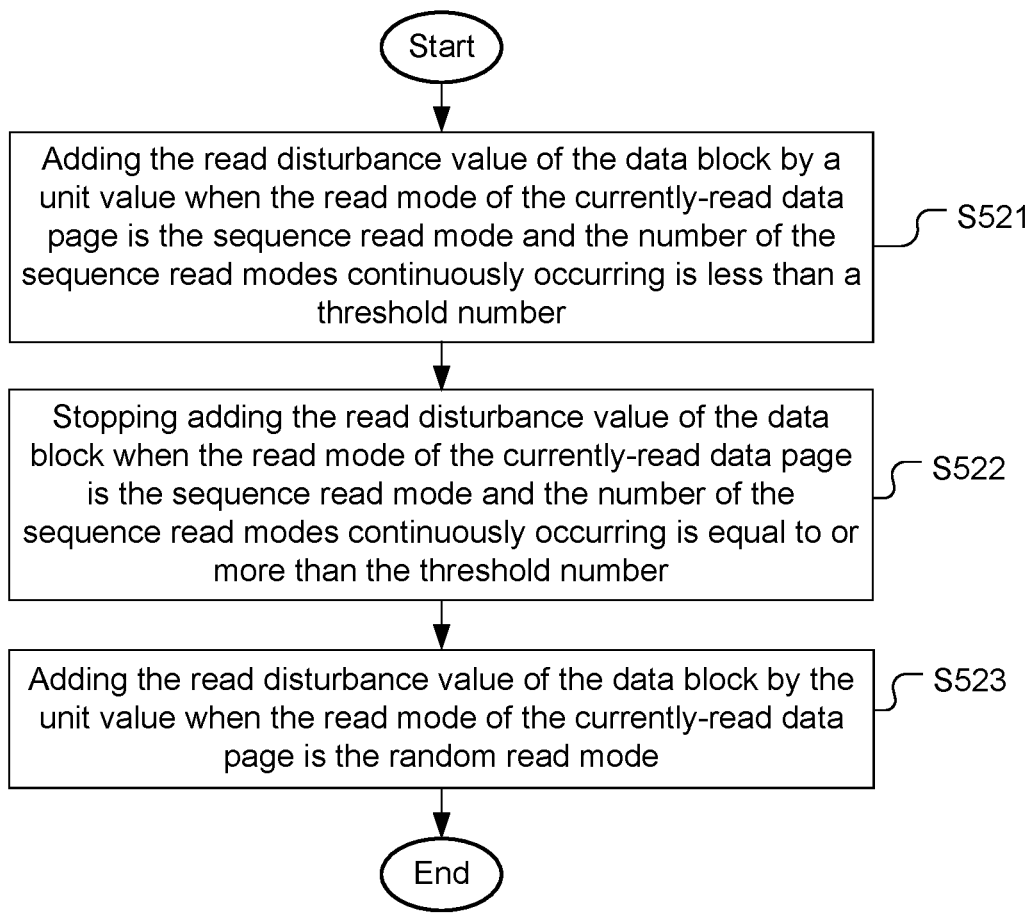
FIG. 5 illustrates a flow chart of a method for processing data in a flash memory according to a fourth embodiment of the present disclosure.

Referring to FIG. 5, a flow chart of a method for processing data in the flash memory 100 according to a fourth embodiment of the present disclosure is illustrated. The method in this embodiment is based on the method for processing data in the above embodiments. In this embodiment, the block S22 may include the following blocks.

At block S521, the read disturbance value of the data block 110 is added by a unit value when the read mode of the currently-read data page is the sequence read mode and the number of the sequence read modes continuously occurring is less than a threshold number.

The read disturbance value starts to add from an initial value of zero.

At block S522, adding the read disturbance value of the data block 110 is stopped when the read mode of the currently-read data page is the sequence read mode and the number of the sequence read modes continuously occurring is equal to or more than the threshold number.

At block S523, the read disturbance value of the data block 110 is added by the unit value when the read mode of the currently-read data page is the random read mode.

It should be noted that the order of blocks S521-S523 are only for illustrative purposes, and the blocks S521-S523 may be performed in any order. For example, the block S522 may be performed after the block S523.

When the number of the sequence read mode continuously occurring is less than the threshold number, the read disturbance value of the data block 110 may be a sum of a first value obtained by multiplying the unit value with the number of the sequence read modes continuously occurring and a second value obtained by multiplying the unit value with the total number of the random read modes occurring.

When the number of the sequence read modes continuously occurring is equal to or more than the threshold number, the read disturbance value of the data block 110 may be a sum of a first product for the threshold number and the unit value and a second product for the unit value and the total number of the random read mode occurring.

In one example, during recording the number of the sequence read modes continuously occurring, the unit value for which each data page is read may be different. For example, in the case of the number of the sequence read modes continuously occurring is less than the threshold number, given that the number of the sequence read modes continuously occurring is 3, the continuously occurring order for the data pages is 2→3→4, and the unit value is $\alpha$. Then, the read disturbance value of the data block 110 is added by $1*\alpha$ when the data page 2 is read, the read disturbance value of the data block 110 is added by $0.9*\alpha$ when the data page 3 is read, and the read disturbance value of the data block 110 is added by $0.8*\alpha$ when the data page 4 is read. Thus, the read disturbance value for the number of the sequence read modes continuously occurring is $1*\alpha+0.9*\alpha+0.8*\alpha$. That is, as the number of the sequence read modes continuously occurring increases, the unit value may become less for each data page that is continuously read.

Figure 6:
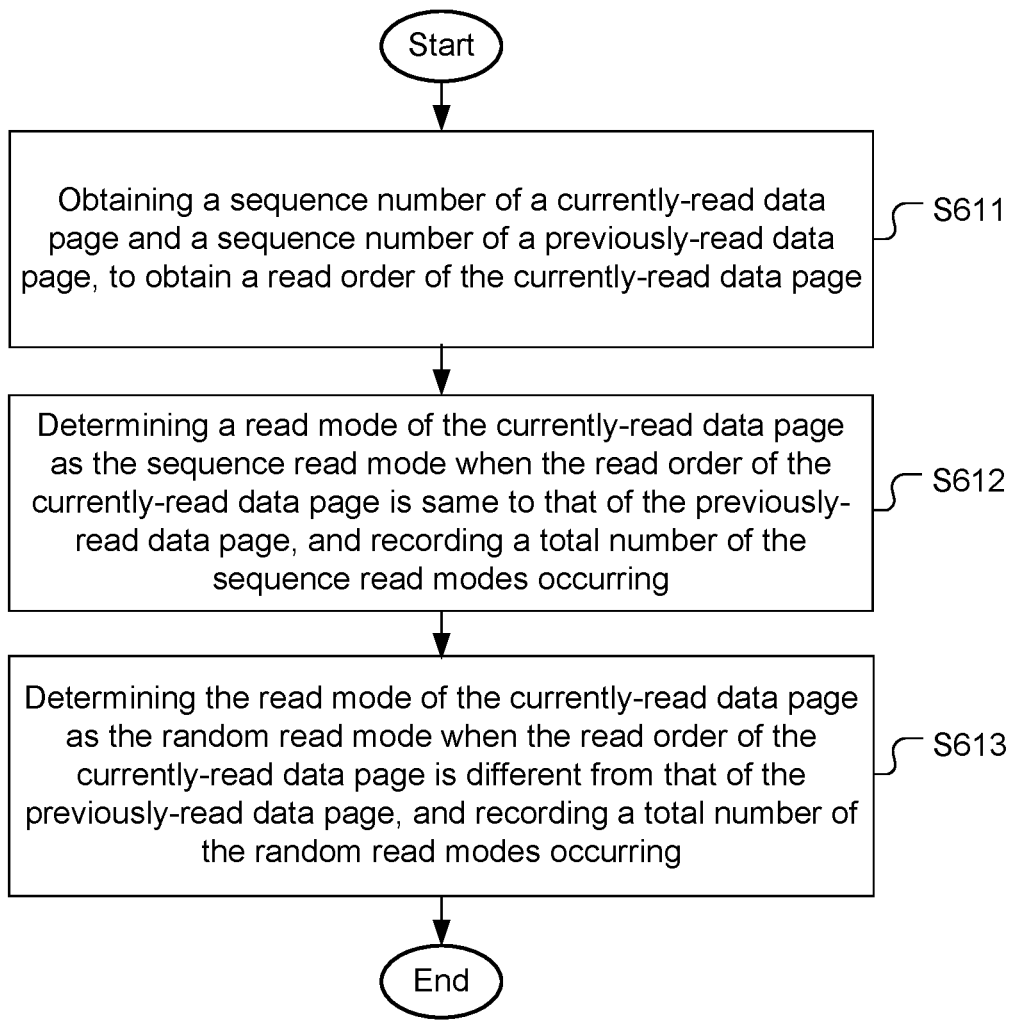
FIG. 6 illustrates a flow chart of a method for processing data in a flash memory according to a fifth embodiment of the present disclosure.

Referring to FIG. 6, a flow chart of a method for processing data in the flash memory 100 according to a fifth embodiment of the present disclosure is illustrated. In this embodiment, the read modes of read operation which are performed on the data block 100 and the number of each of the read modes may be obtained, which may be combined with the above embodiments. The block S21 may include the following blocks.

At block S611, a sequence number of a currently-read data page and a sequence number of a previously-read data page are obtained to obtain a read order of the currently-read data page.

The currently-read data page is a target page by a current read operation from the previously-read data page which is a target page by a previous read operation. In the case of the direction is 1→2→3→4, when the currently-read data page is the data page 2, the read order of the data page 2 is the positive direction. In one example, the sequence number of a data page may be a location where the data page is located in the data block 110 as shown in FIG. 1.

At block S612, a read mode of the currently-read data page is determined as the sequence read mode when the read order of the currently-read data page is same to that of the previously-read data page, and a total number of the sequence read mode occurring is recorded.

At block S613, the read mode of the currently-read data page is determined as the random read mode when the read order of the currently-read data page is different from that of the previously-read data page, and a total number of the random read modes occurring is recorded.

It should be noted that the performing order of blocks S611-S613 are only for illustrative purposes, the blocks S611-S613 may be performed in any order. For example, the block S612 may be performed after the block S613.

In this embodiment, the read mode of the currently-read data page is determined by the read orders of the currently-read data page and the previously-read data page, and then the total number of the sequence read modes occurring and the total number of the random read modes occurring may be derived.

Figure 7:
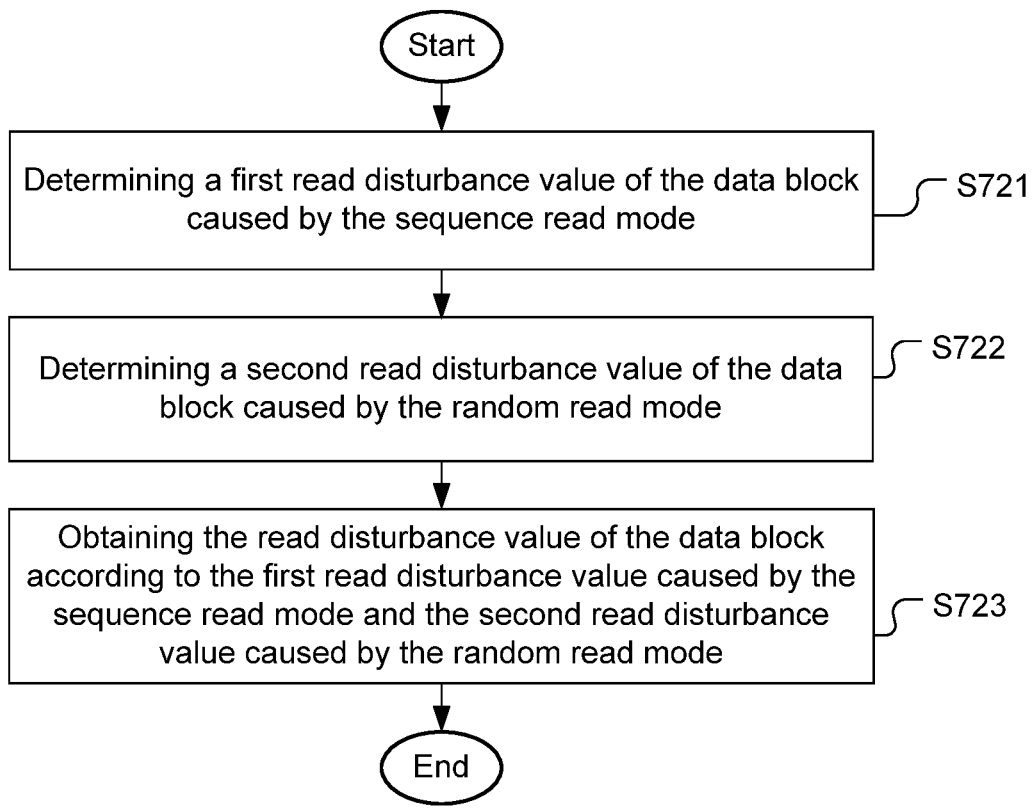
FIG. 7 illustrates a flow chart of a method for processing data in a flash memory according to a six embodiment of the present disclosure.

Referring to FIG. 7, a flow chart of a method for processing data in the flash memory 100 according to a six embodiment of the present disclosure is illustrated. The method in this embodiment is based on the method for processing data in the fifth embodiment. In this embodiment, the block S22 may include the following blocks.

At block S721, a first read disturbance value of the data block 110 caused by the sequence read mode is determined.

In one example, the first read disturbance value caused by the sequence read mode is determined according to a weight coefficient of the sequence read mode and the total number of the sequence read modes occurring.

At block S722, a second read disturbance value of the data block 110 caused by the random read mode is determined.

The second read disturbance value caused by the random read mode is determined according to a weight coefficient of the random read mode and the total number of the random read modes occurring.

At block S723, the read disturbance value of the data block 110 is obtained according to the first read disturbance value caused by the sequence read mode and the second read disturbance value caused by the random read mode.

In one example, the read disturbance value of the data block 110 may be a sum of the first read disturbance value and the second read disturbance value. Assuming the weight coefficients of the sequence read mode and the random read mode are x1 and x2, respectively, the total number of the sequence read modes occurring is y1, and the total number of the random read modes occurring is y2, then the first read disturbance value is $x1*y1$ and the second read disturbance value is $x2*y2$. Therefore, the read disturbance value of the data block 110 is $(x1*y1+x2*y2)$.

In one example, the weight coefficient of the sequence read mode is less than the weight coefficient of the random read mode. For example, the weight coefficient of the sequence read mode is 0.5 times of the weight coefficient of the random read mode. In one example, the weight coefficient of the sequence read mode may be determined by the number of the sequence read modes continuously occurring. That is, the weight coefficient of the sequence read mode is related to a number of read operations for sequence read modes that are continuously performed on the data block 110.

The flowcharts shown above are intended for serving as examples to illustrate embodiments of the present disclosure. A person skilled in the art may practice the present embodiments by modifying individual steps, splitting or combining steps with departing from the spirit of the present disclosure.

Figure 8:
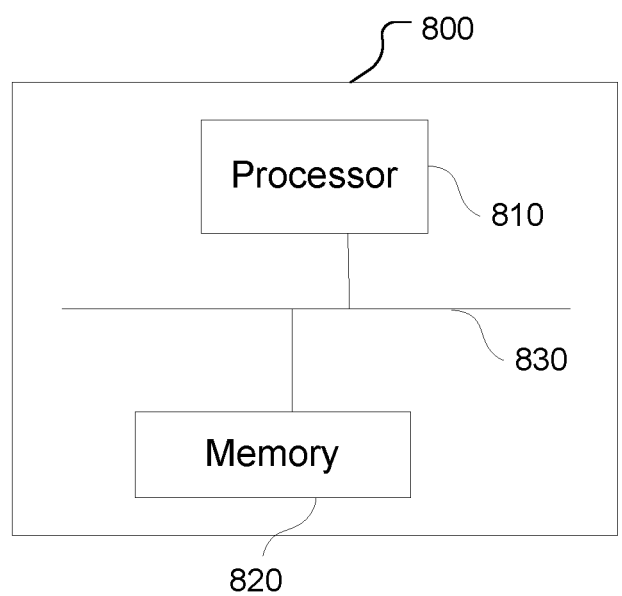
FIG. 8 illustrates a schematic view of an apparatus for processing data in a flash memory according to an embodiment of the present disclosure.

Referring to FIG. 8, a schematic view of an apparatus for processing data in the flash memory 100 according to an embodiment of the present disclosure is illustrated. The apparatus 800 includes a processor 810 and a memory 820 connected to the processor 810 through a bus 830.

The processor 810 controls operations of the apparatus. The processor 810 may be a central processing unit (CPU). The processor 810 may be an integrated circuit chip with an ability to process signals. The processor 810 may also be a common processor, a digital signal processor (DSP), an application-specific integrated circuit (ASIC), a field-programmable gate array (FPGA) or another programmable logical device, a discrete gate or transistor logic component, or a discrete hardware component. The common processor may be a micro-processor, or also any conventional processor.

The processor 810 may be configured for performing programs to achieve any one of the methods for processing data in the flash memory 100 according to the first to six embodiments or a method provided with an arbitrary and non-conflicting combination of methods for processing data in the flash memory 100 therein.

The memory 820 may include a read-only memory and a random access memory, and configured to provide instructions and data for the processor 810, such as the number of the sequence read modes continuously occurring, the total number of the random read modes occurring, and the unit value. A part of the memory 820 may further include a non-volatile random access memory (NVRAM). The memory 820 may store computer programs or operation instructions, or its sub-set, or its extended set. The operation instructions, which may include different kinds of operation instructions, are configured to perform different kinds of operations. The operation system, including different kinds of system programs, is configured to perform different kinds of basic services and process tasks based on hardware.

In another embodiment, the apparatus 800 for processing data may be a single processor.

The above description is presented to enable a person of ordinary skill in the art to practice the present disclosure as provided in the context of a particular application and its requirement. Various modifications to the described embodiments will be apparent to those with skill in the art, and the general principles defined herein may be applied to other embodiments. Therefore, the present disclosure is not intended to be limited to the particular embodiments shown and described, but is to be accorded the widest scope consistent with the principles and novel features herein disclosed. In the above detailed description, various specific details are illustrated in order to provide a thorough understanding of the present disclosure. Nevertheless, it will be understood by those skilled in the art that the present disclosure may be practiced.

Embodiment of the present disclosure as described above may be implemented in various hardware, software codes, or a combination of both. For example, an embodiment of the present disclosure can be one or more electronic circuits integrated into a video compression chip or program code integrated into video compression software to perform the processing described herein. An embodiment of the present invention may also be program code to be executed on a DSP to perform the processing described herein. The embodiments of the disclosure may also involve a number of functions to be performed by a computer processor, a digital signal processor, a microprocessor, or a FPGA. These processors can be configured to perform particular tasks according to the embodiments of the disclosure, by executing machine-readable software code or firmware code that defines the particular methods embodied by the disclosure. The software code or firmware code may be developed in different programming languages and different formats or styles. The software code may also be compiled for different target platforms. However, different code formats, styles and languages of software codes and other means of configuring code to perform the tasks in accordance with the embodiments will not depart from the spirit and scope of the disclosure.

The disclosure may be embodied in other specific forms without departing from its spirit or essential characteristics. The described examples are to be considered in all respects only as illustrative and not restrictive. The scope of the disclosure is therefore, indicated by the appended claims rather than by the foregoing description. All changes which come within the meaning and range of equivalency of the claims are to be embraced within their scope.

What is claimed is:

1. A method for processing data in a flash memory, wherein the flash memory has a plurality of data blocks for storing data, the method comprising:

obtaining read modes of read operations which are performed on a data block and a number of each of the read modes, wherein the read modes comprise a sequence read mode and a random read mode;

determining a read disturbance value of the data block based on the read modes and the number of each of the read modes; and performing a data move operation for the data block when the read disturbance value of the data block is above a threshold;

wherein the data block includes a plurality of data pages which are arranged in an order; and wherein the obtaining read modes of read operations which are performed on a data block and a number of each of the read modes, comprises:

obtaining a sequence number of a currently-read data page and a sequence number of a previously-read data page, to obtain a read order of the currently-read data page, wherein the currently-read data page is a target page by a current read operation from the previously-read data page which is a target page by a previous read operation;

determining a read mode of the currently-read data page as the sequence read mode when the read order of the currently-read data page is same to that of the previously-read data page, and recording a number of the sequence read mode continuously occurring; and determining the read mode of the currently-read data page as the random read mode when the read order of the currently-read data page is different from that of the previously-read data page, and recording a total number of the random read modes occurring; or wherein the obtaining read modes of read operation which are performed on the data block and a number of each of the read modes, comprises:

obtaining a sequence number of a currently-read data page and a sequence number of a previously-read data page, to obtain a read order of the currently-read data page, wherein the currently-read data page is a target page by a current read operation from the previously-read data page which is a target page by a previous read operation;

determining a read mode of the currently-read data page as the sequence read mode when the read order of the currently-read data page is same to that of the previously-read data page, and recording a total number of the sequence read modes occurring; and determining the read mode of the currently-read data page as the random read mode when the read order of the currently-read data page is different from that of the previously-read data page, and recording a total number of the random read modes occurring.

2. The method of claim 1, wherein the recording a number of the sequence read mode continuously occurring, comprises:

adding the number of the sequence read modes continuously occurring by 1 when the read mode of the currently-read data page is the sequence read mode; and setting the number of the sequence read modes to zero when the read mode of the currently-read data page is the random read mode, and adding a number of the random read modes by 1 to record the total number of the random read modes occurring.

3. The method of claim 2, wherein the determining the read disturbance value of the data block based on the read modes and the number of each of the read modes, comprises:

adding the read disturbance value of the data block by a unit value when the read mode of the currently-read data page is the sequence read mode and the number of the sequence read modes continuously occurring is less than a threshold number;

stopping the adding the read disturbance value of the data block when the read mode of the currently-read data page is the sequence read mode and the number of the sequence read modes continuously occurring is equal to or more than the threshold number; and adding the read disturbance value of the data block by the unit value when the read mode of the currently-read data page is the random read mode;

wherein the read disturbance value starts to add from an initial value of zero.

4. The method of claim 1, wherein the determining the read disturbance value of the data block based on the read modes and the number of each of the read modes, comprises:

determining a first read disturbance value of the data block caused by the sequence read mode;

determining a second read disturbance value of the data block caused by the random read mode; and obtaining the read disturbance value of the data block according to the first read disturbance value caused by the sequence read mode and the second read disturbance value caused by the random read mode.

5. The method of claim 4, wherein the first read disturbance value caused by the sequence read mode is determined according to a weight coefficient of the sequence read mode and the total number of the sequence read modes occurring; and the second read disturbance value caused by the random read mode is determined according to a weight coefficient of the random read mode and the total number of the random read modes occurring.

6. The method of claim 5, wherein the weight coefficient of the sequence read mode is less than the weight coefficient of the random read mode.

7. The method of claim 1, wherein the read order of the currently-read data page is a positive direction when the sequence number of the currently-read data page is greater than the sequence number of the previously-read data page, and the read order of the currently-read data page is a negative direction when the sequence number of the currently-read data page is less than the sequence number of the previously-read data page.

8. An apparatus for processing data in a flash memory, wherein the flash memory has a plurality of data blocks for data storage, and the apparatus comprises a processor configured to:

obtain read modes of read operations which are performed on a data block and a number of each of the read modes, wherein the read modes comprise a sequence read mode and a random read mode;

determine a read disturbance value of the data block based on the read modes and the number of each of the read modes; and perform a data move operation for the data block when the read disturbance value of the data block is above a threshold;

wherein the data block includes a plurality of data pages which are arranged in an order; and the processor is further configured to:

obtain a sequence number of a currently-read data page and a sequence number of a previously-read data page, to obtain a read order of the currently-read data page, wherein the currently-read data page is a target page by a current read operation from the previously-read data page which is a target page by a previous read operation;

determine a read mode of the currently-read data page as the sequence read mode when the read order of the currently-read data page is same to that of the previously-read data page, and record a number of the sequence read mode continuously occurring; and determine the read mode of the currently-read data page as the random read mode when the read order of the currently-read data page is different from that of the previously-read data page, and record a total number of the random read mode occurring; or wherein the processor is further configured to:

obtain a sequence number of a currently-read data page and a sequence number of a previously-read data page, to obtain a read order of the currently-read data page, wherein the currently-read data page is a target page by a current read operation from the previously-read data page which is a target page by a previous read operation;

determine a read mode of the currently-read data page as the sequence read mode when the read order of the currently-read data page is same to that of the previously-read data page, and record a total number of the sequence read modes occurring; and determine the read mode of the currently-read data page as the random read mode when the read order of the currently-read data page is different from that of the previously-read data page, and record a total number of the random read modes occurring.

9. The apparatus of claim 8, wherein the processor is further configured to:

add the number of the sequence read modes continuously occurring by 1 when the read mode of the currently-read data page is the sequence read mode; and set the number of the sequence read modes to zero when the read mode of the currently-read data page is the random read mode, and add a number of the random read modes by 1 to record the total number of the random read modes occurring.

10. The apparatus of claim 9, wherein the processor is further configured to:
- add the read disturbance value of the data block by a unit value when the read mode of the currently-read data page is the sequence read mode and the number of the sequence read modes continuously occurring is less than a threshold number;
- stop adding the read disturbance value of the data block when the read mode of the currently-read data page is the sequence read mode and the number of the sequence read modes continuously occurring is equal to or more than the threshold number; and
- add the read disturbance value of the data block by the unit value when the read mode of the currently-read data page is the random read mode;
- wherein the read disturbance value starts to add from an initial value of zero.

11. The apparatus of claim 8, wherein the processor is further configured to:
- determine a first read disturbance value of the data block caused by the sequence read mode;
- determine a second read disturbance value of the data block caused by the random read mode; and
- obtain the read disturbance value of the data block according to the first read disturbance value caused by the sequence read mode and the second read disturbance value caused by the random read mode.

12. The apparatus of claim 11, wherein the first read disturbance value caused by the sequence read mode is determined according to a weight coefficient of the sequence read mode and the total number of the sequence read modes occurring; and the second read disturbance value caused by the random read mode is determined according to a weight coefficient of the random read mode and the total number of the random read modes occurring.

13. The apparatus of claim 12, wherein the weight coefficient of the sequence read mode is less than the weight coefficient of the random read mode.

14. A non-transitory computer readable medium storing computer programs which, when executed by a processor, cause the processor to perform a method for processing data in a flash memory having a plurality of data blocks for data storage, the method comprising:
- obtaining read modes of read operations which are performed on a data block and a number of each of the read modes, wherein the read modes comprises a sequence read mode and a random read mode;
- determining a read disturbance value of the data block based on the read modes and the number of each of the read modes; and
- performing a data move operation for the data block when the read disturbance value of the data block is above a threshold;
- wherein the data block includes a plurality of data pages which are arranged in an order; and
- wherein the obtaining read modes of read operations which are performed on a data block and a number of each of the read modes, comprises:
  - obtaining a sequence number of a currently-read data page and a sequence number of a previously-read data page, to obtain a read order of the currently-read data page, wherein the currently-read data page is a target page by a current read operation from the previously-read data page which is a target page by a previous read operation;
  - determining a read mode of the currently-read data page as the sequence read mode when the read order of the currently-read data page is same to that of the previously-read data page, and recording a number of the sequence read mode continuously occurring; and
  - determining the read mode of the currently-read data page as the random read mode when the read order of the currently-read data page is different from that of the previously-read data page, and recording a total number of the random read modes occurring; or
- wherein the obtaining read modes of read operation which are performed on the data block and a number of each of the read modes, comprises:
  - obtaining a sequence number of a currently-read data page and a sequence number of a previously-read data page, to obtain a read order of the currently-read data page, wherein the currently-read data page is a target page by a current read operation from the previously-read data page which is a target page by a previous read operation;
  - determining a read mode of the currently-read data page as the sequence read mode when the read order of the currently-read data page is same to that of the previously-read data page, and recording a total number of the sequence read modes occurring; and
  - determining the read mode of the currently-read data page as the random read mode when the read order of the currently-read data page is different from that of the previously-read data page, and recording a total number of the random read modes occurring.

* * * * *